United States Patent [19]  
Masuda et al.

[11] Patent Number: 4,804,868  
[45] Date of Patent: Feb. 14, 1989

[54] BIMOS LOGICAL CIRCUIT

[75] Inventors: Masami Masuda, Kawasaki; Takayuki Kawaguchi; Yasumitsu Nozawa, both of Yokohama, all of Japan

[73] Assignee: Kabushiki Kaisha Toshiba, Kanagawa, Japan

[21] Appl. No.: 106,362

[22] Filed: Oct. 9, 1987

[30] Foreign Application Priority Data

Mar. 27, 1987 [JP] Japan ................................. 62-73462

[51] Int. Cl.$^4$ .................. H03K 19/01; H03K 19/003; H03K 19/082; H03K 19/094
[52] U.S. Cl. ..................................... 307/446; 307/570
[58] Field of Search .............. 307/446, 570, 475, 450, 307/451, 452, 453, 571, 279, 443, 270

[56] References Cited

U.S. PATENT DOCUMENTS 4,694,203  9/1987  Uragami et al. .................... 307/446  
4,740,718  4/1988  Matsui ................................. 307/446

Primary Examiner—Stanley D. Miller  
Assistant Examiner—David R. Bertelson  
Attorney, Agent, or Firm—Foley & Lardner, Schwartz, Jeffery, Schwaab, Mack, Blumenthal & Evans

[57] ABSTRACT

This invention is a BiMOS logical circuit that provides a suitable output level with a limited number of components. The intermediate node of a PMOS transistor and an NMOS transistor is connected to the base of a bipolar transistor to control output voltage. The NMOS transistor is connected between the output terminal and the power source, and an output voltage approximately equal to the power supply voltage is obtained at the output terminal.

2 Claims, 2 Drawing Sheets

BIMOS LOGICAL CIRCUIT

BACKGROUND OF THE INVENTION

The present invention relates to a BiMOS logical circuit, and more particularly to a BiMOS logical circuit including a bipolar transistor at its output stage.

Recently, logic LSIs are strongly required to have large capacity and low power dissipation. Accordingly, there is a tendency that the position of CMOS transistors to meet such requirements is being increasingly elevated. The performance of the CMOS transistors has been considerably improved in recent years by making free use of fining technologies.

A typical logical circuit using such CMOS transistors is shown in FIG. 1. This circuit is composed of four MOS transistors, i.e., two PMOS transistors 1 and 2 and two NMOS transistors 3 and 4, whereby when an input voltage $V_{IN}$ represents "L" and a control signal $\phi$ represents "L", an output of "H" is produced as $V_{OUT}$ and when otherwise, an output of "L" is produced.

However, the circuits using such CMOS transistors have the serious drawback that the operating speed is slower than that of the circuits using bipolar transistors because the current drivability is small. To improve the current drivability, there may be employed a method to increase the capacity of each component. However, this method is not so effective in that the employment thereof results in an increase in the gate capacity. Such a method eventually leads to the bad effect that it runs counter to integration because the area occupation of components becomes large.

To eliminate this, a BiMOS logical circuit using a bipolar transistor at its output stage is employed. FIG. 2 shows an example of such a BiMOS logical circuit. This circuit is composed of seven MOS transistors, i.e., PMOS transistors 5 and 6 and NMOS transistors 7 to 11, and two bipolar transistors 12 and 13. The base currents of the bipolar transistors 12 and 13 are controlled by the MOS transistors and the bipolar transistors are used for the output stage. For this reason, the current drivability is improved and thus a fast operating speed at which the output waveform becomes sharp can be obtained.

FIG. 3 is another example of a BiMOS logical circuit. This circuit is composed of PMOS transistors 14 and 15, NMOS transistors 16 to 18, bipolar transistors 19 and 20, and a diode 21. By the diode 21, the side of the MOS circuit is electrically isolated from the output side.

One problem with the above-mentioned conventional logical circuits is that the number of components increases. For instance, when a circuit constituted solely with CMOS transistors is employed for realizing a certain logic, it is sufficient to use four components as shown in FIG. 1. On the contrary, for realizing the same logic as stated above, when the BiMOS logical circuit shown in FIG. 2 is employed, seven MOS transistors and two bipolar transistors are required, and when the BiMOS logical circuit shown in FIG. 3 is employed, five MOS transistors, two bipolar transistors and one diode are required.

Another problem therewith is that an ideal output level cannot be obtained. For instance, with the shown in FIG. 2, the voltage value at "L" level of the output $V_{OUT}$ is not equal to the ideal ground level. This is because a voltage difference $V_F$ occurs across the base and emitter of the transistor 13. Accordingly, the voltage value at "L" level of the output $V_{OUT}$ does not become equal to zero, but becomes equal to $V_F$. With the circuit shown in FIG. 3, this problem is more serious. Namely, since a current from the output terminal flows into the base of the transistor 20 via the diode 21, the voltage value at "L" level of the output $V_{OUT}$ becomes equal to a value obtained by adding the forward voltage drop $V_D$ to the base-emitter voltage $V_F$ of the transistor 20. Accordingly, the voltage value at "L" level of the output $V_{OUT}$ will become equal to a value considerably different from the ideal ground level.

SUMMARY OF THE INVENTION

It is therefore an object of the present invention to provide a BiMOS logical circuit capable of reducing the number of components and of providing an ideal output level.

According to the present invention, there is provided a BiMOS logical circuit comprising: a first transistor comprised of a PMOS transistor; a second transistor comprised of an NMOS transistor; a third transistor comprised of a bipolar transistor; a fourth transistor comprised of an NMOS transistor; and a fifth transistor comprised of an NMOS transistor; one end of the first transistor and one end of the second transistor being connected to each other at their intermediate node, the gate of the first transistor and the gate of the second transistor being connected to an input terminal, a first power supply voltage being applied to the other end of one of the first and second transistors, a control signal being delivered to the other end of the other thereof; the base of the third transistor being connected to the intermediate node, a second power supply voltage being applied to one of the collector or the emitter of the third transistor, an output terminal being connected to the other thereof; and respective one ends of the fourth and fifth transistors being connected to the output terminal, the first power supply voltage being applied to respective the other ends thereof, the gate of the fourth transistor being connected to the input terminal, a signal complementary to the control signal being delivered to the gate of the fifth transistor.

A BiMOS logical circuit according to the present invention is implemented to connect the intermediate node of the PMOS transistor and the NMOS transistor to the base of the bipolar transistor to effect a control, thus making it possible to reduce the number of components. Since the NMOS transistor is connected between the output terminal and the power source, an output voltage approximately equal to the power supply voltage is obtained at the output terminal, thus making it possible to provide an ideal output level.

DESCRIPTION OF THE PREFERRED EMBODIMENTS

Figure 4:
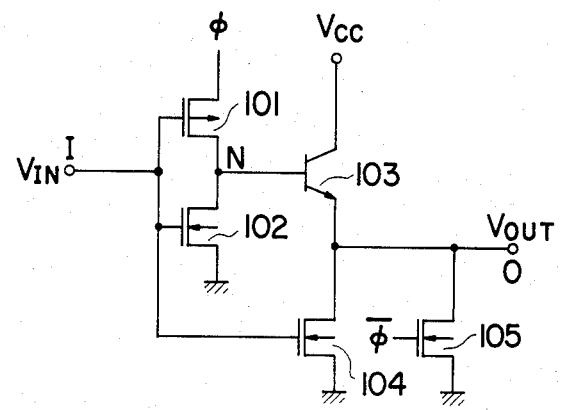
FIG. 4 is a circuit diagram illustrating one embodiment of a BiMOS logical circuit according to the present invention.

The present invention will be described in connection with embodiments shown. FIG. 4 is a circuit diagram illustrating an embodiment of a BiMOS logical circuit according to the present invention. This circuit is composed of a PMOS transistor 101, an NMOS transistor 102, a bipolar transistor 103, and NMOS transistors 104 and 105. In this circuit, the PMOS transistor 101 and the NMOS transistor 102 are connected in series to each other at their intermediate node N. The gates of the PMOS transistor 101 and the NMOS transistor 102 are connected commonly to the input terminal I. One terminal of the NMOS transistor 102 are grounded and a control signal $\phi$ is delivered to one terminal of the PMOS transistor 101.

The base of the bipolar transistor 103 is connected to the intermediate node N, the collector thereof to the power source $V_{CC}$, and the emitter to the output terminal O. One terminals of the NMOS transistors 104 and 105 are grounded, and the other terminals thereof are connected to the output terminal O. The gate of the NMOS 104 is connected to the input terminal I, and a signal $\bar{\phi}$ complementary to the control signal $\phi$ is delivered to the gate of the NMOS transistor 105.

The operation of this circuit is as follows. First in case where an input voltage $V_{IN}$ delivered to the input terminal I represents "L", the PMOS transistor 101 is turned on. At this time, when it is assumed that the control signal $\phi$ represents "H", a current flows in the base of the transistor 103. Thus, the transistor 103 is turned on, so that an output voltage $V_{OUT}$ delivered to the output terminal O becomes "H". At this time, the NMOS transistors 102, 104 and 105 are all cut off, whereby the intermediate node N and the output terminal O are isolated from the grounded point. On the other hand, when it is assumed that the control signal $\phi$ represents "L", the NMOS transistor 105 is turned on. As a result, the output terminal O is grounded, so that the output voltage $V_{OUT}$ becomes zero. Accordingly, in the case where the input voltage $V_{IN}$ represents "L", the output voltage $V_{OUT}$ is controlled by the control signal $\phi$.

In contrast, in case where the input voltage $V_{IN}$ delivered to the input terminal I represents "H", the NMOS transistor 102 is turned on. Thus, the transistor 103 is cut off because its base is grounded. At this time, since the NMOS transistor 104 is turned on, the output terminal O is grounded, so that the output voltage $V_{OUT}$ becomes zero.

The circuit shown in FIG. 4 can be constituted by a relatively small number of components, i.e., five MOS transistors and one bipolar transistor. In addition, since it is sufficient that the PMOS transistor 101 and the NMOS transistor 102 have only an ability necessary for delivering a current in the base of the bipolar transistor 103, this circuit can be constituted with small-sized components. Assuming now that the amplification factor of the bipolar transistor 103 is represented by $\beta$ and a current therein is represented by i, it is sufficient that a current of $i/\beta$ is caused to flow in the PMOS transistor 101. Accordingly, additional capacity with respect to the control signal $\phi$ can be suppressed to a small value. Further, since the "L" level of the output voltage $V_{OUT}$ is obtained by allowing the NMOS transistor 104 or 105 to ground the output terminal O, an ideal output level can be obtained.

Figure 1:
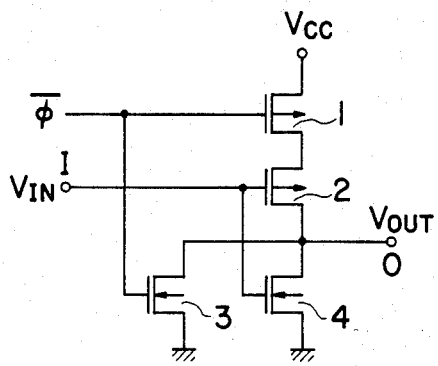
FIG. 1 is a circuit diagram illustrating a conventional CMOS logical circuit.
Figure 2:
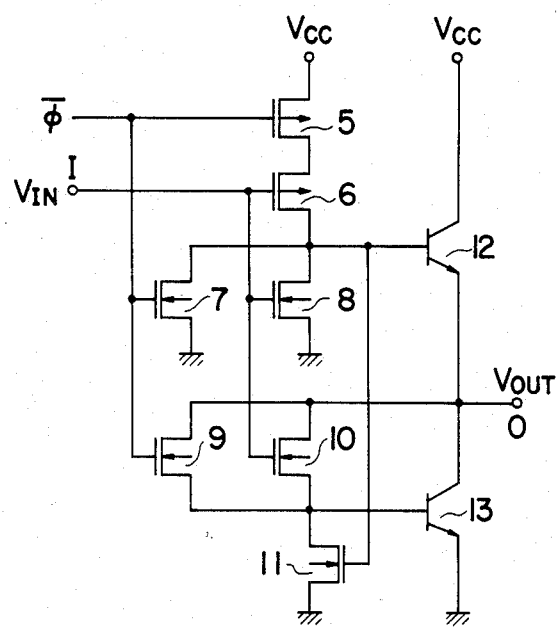
FIGS. 2 and 3 are circuit diagrams illustrating conventional BiMOS logical circuits, respectively.
Figure 3:
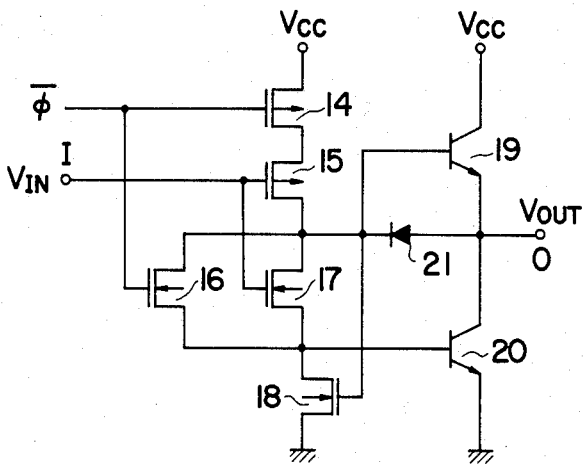
Figure 5:
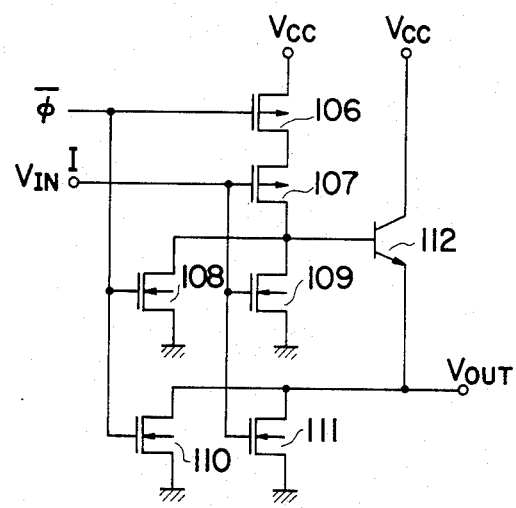
FIG. 5 is a circuit diagram illustrating another circuit in which the principle of the invention is utilized.

FIG. 5 is a circuit diagram illustrating another circuit in which the principle of the invention is utilized. This circuit is composed of PMOS transistors 106 and 107, NMOS transistors 108 to 111, and a bipolar transistor 112. This circuit will be explained by the comparison with the circuit shown in FIG. 1. The PMOS transistor 107 and the NMOS transistor 109 correspond to the PMOS transistor 101 and the NMOS transistor 102, respectively. These transistors 107 and 109 serve as those receiving an input voltage $V_{IN}$. In addition, the NMOS transistors 110 and 111 correspond to NMOS transistors 104 and 105, respectively. These transistors 110 and 111 serve to allow the output voltage $V_{OUT}$ to be equal to zero. This circuit differs from the circuit shown in FIG. 4 in connection with the manner of how control signal is delivered. In this circuit, by controlling gates of the PMOS transistor 106 and the NMOS transistor 108 using a control signal $\bar{\phi}$, the base current of the bipolar transistor 112 is controlled.

As just described above, the BiMOS logical circuit according to the present invention is implemented to connect the intermediate node of the PMOS transistor and the NMOS transistor to the base of the bipolar transistor to effect a control, thus making it possible to reduce the number of components. In addition, since the NMOS transistor is connected between the output terminal and the power source, an output voltage approximately equal to the power supply voltage is obtained on the output terminal, thus making it possible to provide an ideal output level.

What is claimed is:

1. A BiMOS circuit comprising:
   a first transistor comprised of a PMOS transistor;
   a second transistor comprised of an NMOS transistor;
   a third transistor comprised of a bipolar transistor;
   a fourth transistor comprised of an NMOS transistor; and
   a fifth transistor comprised of an NMOS transistor;
   one end of said first transistor and one end of said second transistor being connected to each other at an intermediate node of said respective one ends of said first and second transistors, the gate of said first transistor and the gate of said second transistor being connected to an input terminal, a first power supply voltage being supplied to the other end of one of said first and second transistors, a control signal being delivered to the other end of the other transistor thereof;
   the base of said third transistor being connected to said intermediate node, a second power supply voltage being applied to one of the collector or the emitter of said third transistor, an output terminal being connected to the other thereof;
   respective one ends of said fourth and fifth transistors being connected to said output terminal, said first power supply voltage being applied to the respective other ends thereof, the gate of said fourth transistor being connected to said input terminal, a signal complementary to said control signal being delivered to the gate of said fifth transistor.

2. A BiMOS logical circuit as set forth in claim 1, wherein said third transistor is an NPN-type transistor.

* * * * *